United States Patent
Campbell et al.

(10) Patent No.: US 8,400,791 B2
(45) Date of Patent: Mar. 19, 2013

(54) POWER LAYER GENERATION OF INVERTER GATE DRIVE SIGNALS

(75) Inventors: Alan J. Campbell, New Berlin, WI (US); Richard H. Radosevich, Waukesha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 215 days.

(21) Appl. No.: 12/838,255

(22) Filed: Jul. 16, 2010

(65) Prior Publication Data
US 2012/0013372 A1    Jan. 19, 2012

(51) Int. Cl.
*H02J 3/00* (2006.01)
(52) U.S. Cl. ............................. 363/34; 363/71
(58) Field of Classification Search .............. 363/34, 363/37, 65, 71; 323/349–351; 327/141, 327/144–146
See application file for complete search history.

(56) References Cited

U.S. PATENT DOCUMENTS 6,369,613 B1 *  4/2002  Costello et al. ............... 326/83
7,847,528 B2 * 12/2010  Li et al. ......................... 323/267

* cited by examiner

*Primary Examiner* — Matthew Nguyen
(74) *Attorney, Agent, or Firm* — Fletcher Yoder, P.C.; Alexander R. Kuszewski; John M. Miller

(57) ABSTRACT

Techniques include systems and methods of synchronizing multiple parallel inverters in a power converter system. In one embodiment, control circuitry is connected to a power layer interface circuitry at each of the parallel inverters, via an optical fiber interface. The system is synchronized by transmitting a synchronizing pulse to each of the inverters. Depending on the operational mode of the system, different data exchanges may occur in response to the pulse. In an off mode, power up and power down data may be exchanged between the control circuitry and the inverters. In an initiating mode, identification data may be transmitted from the inverters to the control circuitry. In an active mode, control data may be sent from the control circuitry to the inverters. In some embodiments, the inverters also transmit feedback data and/or acknowledgement signals to the control circuitry. Power layer circuitry of the inverter adjusts a local clock based upon sampled data from the control circuitry to maintain synchronicity of the inverters between synchronization pulses.

6 Claims, 9 Drawing Sheets

POWER LAYER GENERATION OF INVERTER GATE DRIVE SIGNALS

BACKGROUND

The invention relates generally to the field of power conversion devices and more particularly to inverters and their control.

Large number of topographies and types of power conversion circuits are known and are in use. Many of these circuits rely upon inverter topologies for converting direct current (DC) power to control frequency alternating current (AC) power. In many topologies a rectifier or other converter is provided to receive incoming AC power, typically from the grid, and to convert the AC power to DC power that is applied to a DC bus used to feed the inverter circuitry. Such topologies are used in a variety of applications, such as for controlling the speed and operating characteristics of motors.

Motor drives utilizing inverter topologies often employ a single converter and single inverter coupled to one another by a single DC bus. Conventional inverters are formed by solid state switches provided in pairs and alternately switched between conducting and non-conducting states to provide desired output waveforms, typically of controlled frequency. Such topologies are adequate for many smaller applications, and may vary in size depending upon the power rating, frame size, voltage, and other specifications of the driven motor. However, for larger motors the components of such drives become proportionally large and expensive. It becomes attractive, then, to use alternative topologies in which multiple inverters are provided in parallel, with their outputs being joined to provide a common AC output to a load.

Such parallel inverter applications pose unique difficulties. For example, because the outputs of the inverters are essentially shorted to one another, various magnetic structures may be required to prevent circulating currents from being established due to mismatched timing in the switching of the power electronic switches in the inverters. For example, if switches in a first inverter are switched in a manner that is not sufficiently synchronized with switches of a parallel inverter, output power can be allowed to re-enter one or the other of the inverters due to the conductive states of the switches. Because the switching frequencies of such inverter components is quite high, a high degree of precision will be required to prevent such circulating currents absent magnetic structures of the type used in the art. Furthermore, techniques for maintaining synchronous operation of parallel inverters may be more efficiently and accurately conducted in parallel. Sufficient topologies for precise switching and parallel synchronizing techniques have yet to be proposed.

BRIEF DESCRIPTION

The present invention provides techniques for synchronizing inverters designed to respond to such needs. In accordance with one aspect of the present technique, a system is provided for controlling the operation of multiple power inverters connected in parallel. The system includes control circuitry configured to generate timing signals which control the operational state changes of the parallel inverters, such that all operating parallel inverters may maintain synchronous operation. The present technique also includes a conductor, such as a fiber optic cable coupled to the control circuitry for conveying the signals from the control circuitry to an inverter. For example, the signals conveyed from the control circuitry may have embedded data and clocking information which is transmitted from the control circuitry. Power layer circuitry of each inverter is coupled to a respective data conductor and is configured to receive the signals and to compute the timing of the state changes based upon the received signals. A plurality of solid state switches is coupled to the power layer circuitry of each inverter and configured to change state to convert input power to controlled output power based upon the recomputed timing signals. The power layer circuitry of each inverter is further configured to compute feedback information corresponding to data acquisition, and this feedback information is transmitted back to the control circuitry.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
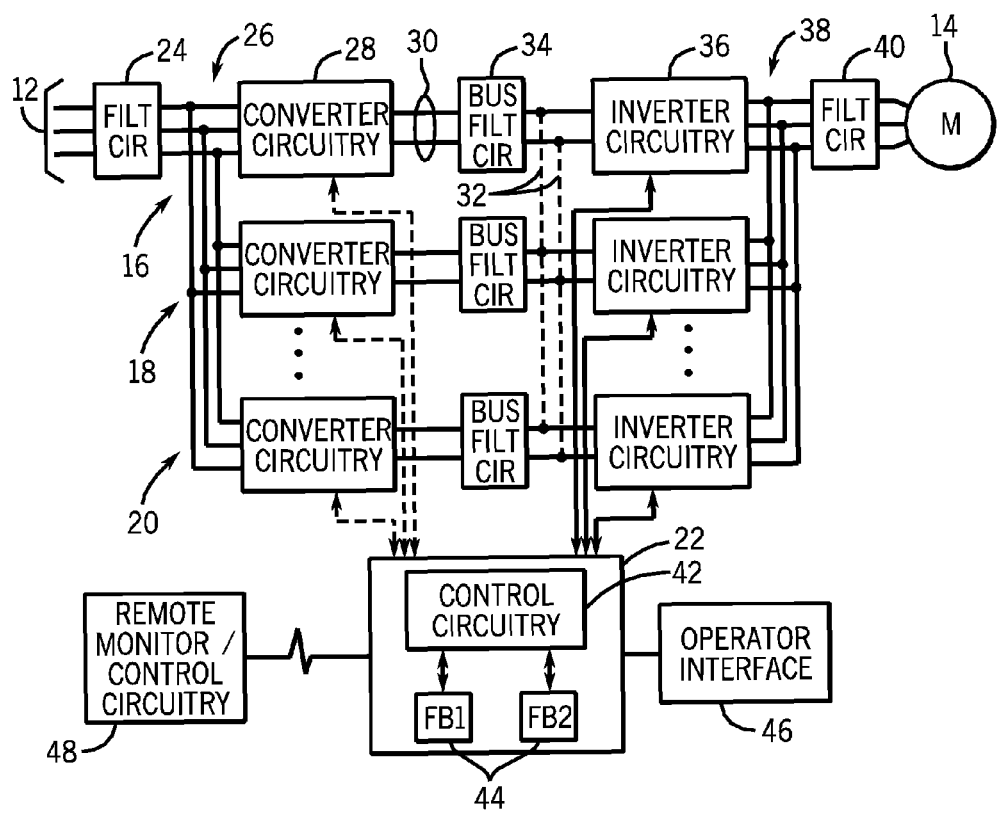
FIG. 1 is a diagrammatical representation of a motor drive system in accordance with certain aspects of the present disclosure.

FIG. 1 represents a drive system 10 in accordance with aspects of the present disclosure. The drive system is configured to be coupled to a source of AC power, such as the power grid, as indicated by reference numeral 12, and to deliver conditioned power to a motor 14 or any other suitable load.

The system 10 comprises a plurality of individual drives coupled to one another in parallel to provide power to the load. In the example illustrated in FIG. 1, for example, a first drive 16 is illustrated as coupled to a second drive 18 and a further drive 20 which may be the third, fourth, fifth or any suitable terminally numbered drive. A presently contemplated embodiment may accommodate up to 5 parallel drives, although fewer or more may be configured in the same way. It should be noted that certain aspects of the techniques described herein may be used with a single drive. However, other aspects are particularly well-suited for multiple parallel drives.

A controller 22 is coupled to the circuitry of each drive and is configured to control operation of the circuitry as described more fully below. In a presently contemplated embodiment, the controller may be housed in one of the drives or in a separate enclosure. Appropriate cabling (e.g., fiber optic cabling) is provided to communicate control and feedback signals between the controller and the circuitry of the individual drives. The controller will coordinate operation of the drives to ensure that the provision of power is shared and that operation of the drives is synchronized sufficiently to provide the desired power output to the motor. In the embodiment illustrated in FIG. 1, power filtering circuitry 24 may be provided upstream of the motor drives. Such circuitry may be provided upstream of a line-side bus 26 or similar circuitry may be provided downstream of the bus in each of the drives. Such circuitry may include inductors, capacitors, circuit breakers, fuses, and so forth that are generally conventional in design and application.

The power bus 26 distributes three phases of AC power between the individual drives. Downstream of this bus, each drive includes converter circuitry 28 that converts the three phases of AC power to DC power that is applied to a DC bus 30. The converter circuitry 28 may be passive or active. That is, in a presently contemplated embodiment non-gate driven circuitry alone is used to define a full wave rectifier that converts the incoming AC power to DC power that is applied to the bus. In other embodiments the converter circuitry 28 may be active or gate driven, including controlled power electronic switches that are switched between conducting and non-conducting states to control the characteristics of the DC power applied to the bus.

Continuing with the components of each drive, bus filtering circuitry 34 may be provided that conditions the DC power conveyed along the DC busses 30. Such filtering circuitry may include, for example, capacitors, inductors (e.g., chokes), braking resistors, and so forth. In some embodiments common devices may be provided on the DC busses, which may be coupled to one another by links illustrated by reference numeral 32.

Each drive further includes inverter circuitry 36. As will be appreciated by those skilled in the art, such circuitry will typically include sets of power electronic switches, such as insulated gate bipolar transistors (IGBTs) and diodes arranged to allow for converting the DC power from the bus to controlled frequency AC output waveforms. The inverters thus create three phases of controlled frequency output, with each phase being shorted or combined along an output bus 38. The combined power may be applied to output filtration circuitry 40, which may include magnetic components that couple the output power between the phases. Such circuitry may also be provided along the load-side bus 38.

The controller 22 will typically include control circuitry 42 that is configured to implement various control regimes by properly signaling the inverter circuitry (and, where appropriate, the converter circuitry) to control the power electronic switches within these circuits. The control circuitry 42 may, for example, include any suitable processor, such as a microprocessor, field programmable gate array (FPGA), memory circuitry, supporting power supplies, and so forth. In motor drive applications, the control circuitry may be configured to implement various desired control regimes, such as for speed regulation, torque control, vector control, start-up regimes, and so forth. In the embodiment illustrated in FIG. 1, various functional circuit boards 44 are linked to the control circuitry and may be provided for specific functions. For example, a wide range of options may be implemented by the use of such circuitry, including the control regimes mentioned above, as well as various communications options, safety options, and so forth.

The controller will typically allow for connection to an operator interface, which may be local at the controller and/or remote from it. In a presently contemplated embodiment, for example, an operator interface 46 may be physically positioned on the controller but removable for hand-held interfacing. The interface circuitry (e.g., portable computers) may also be coupled permanently or occasionally to the controller, such as via Internet cabling, or other network protocols, including standard industrial control protocols. Finally, the controller may be coupled to various remote monitoring and control circuitry as indicated by reference numeral 48. Such circuitry may include monitoring stations, control stations, control rooms, remote programming stations, and so forth. It should be noted that such circuitry may also include other drives, such that the operation of the system 10 may be coordinated, where desired, with that of other equipment. Such coordination is particularly useful in automation settings where a large number of operations are performed in a coordinated manner. Thus, the control circuitry 42 may form its control in coordination with logic implemented by automation controllers, separate computers, and so forth.

Figure 2:
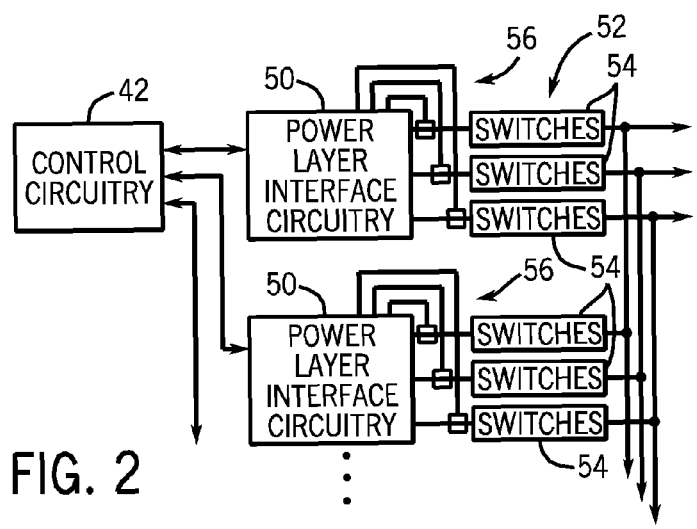
FIG. 2 is further diagrammatical representation of a portion of the system of FIG. 1 illustrating power layer interface circuitry used in the multiple parallel motor drives.

FIG. 2 illustrates certain of the components that may be included within the individual drives described above. For example, the control circuitry 42 is illustrated as being coupled to power layer interface circuitry 50. Such circuitry will be provided in each drive and will operate independently within the drive, but in a coordinated manner under the control of the control circuitry. The power layer interface circuitry may include a range of circuits, such as a dedicated processor, memory, and so forth. In a presently contemplated embodiment, the power layer interface circuitry 50 includes an FPGA that implements programming for carrying out control of the power electronic switches within the individual drive. The power layer interface circuitry thus communicates with the power layer as indicated by reference numeral 52, which is itself comprised of sets of power electronic devices, such as IGBTs and diodes. These switches are illustrated generally by reference numeral 54. In a typical arrangement, the switches may be provided on a single support or on multiple supports. For example, in a presently contemplated embodiment separate supports are provided for each phase of power, with multiple IGBTs and diodes being provided on each support. These devices themselves may be constructed in any suitable manner, such as direct bond copper stacks, lead frame packages, and so forth. In general, one or several types of feedback will be provided in the circuitry as indicated by reference numeral 56. Such feedback may include, for example, output voltages, output currents, temperatures, and so forth. Other feedback signals may be provided throughout the system, such as to allow the control circuitry to monitor the electrical parameters of the incoming power, the outgoing power, the DC bus power, and so forth.

The structure and operation of the control circuitry may be substantially similar to those described in U.S. published patent application no. 20100123422, entitled "Motor Controller with Deterministic Synchronous Interrupt having Multiple Serial Interface Backplane," filed by Campbell et al. on Nov. 17, 2008, which is hereby incorporated into the present disclosure by reference.

Figure 3:
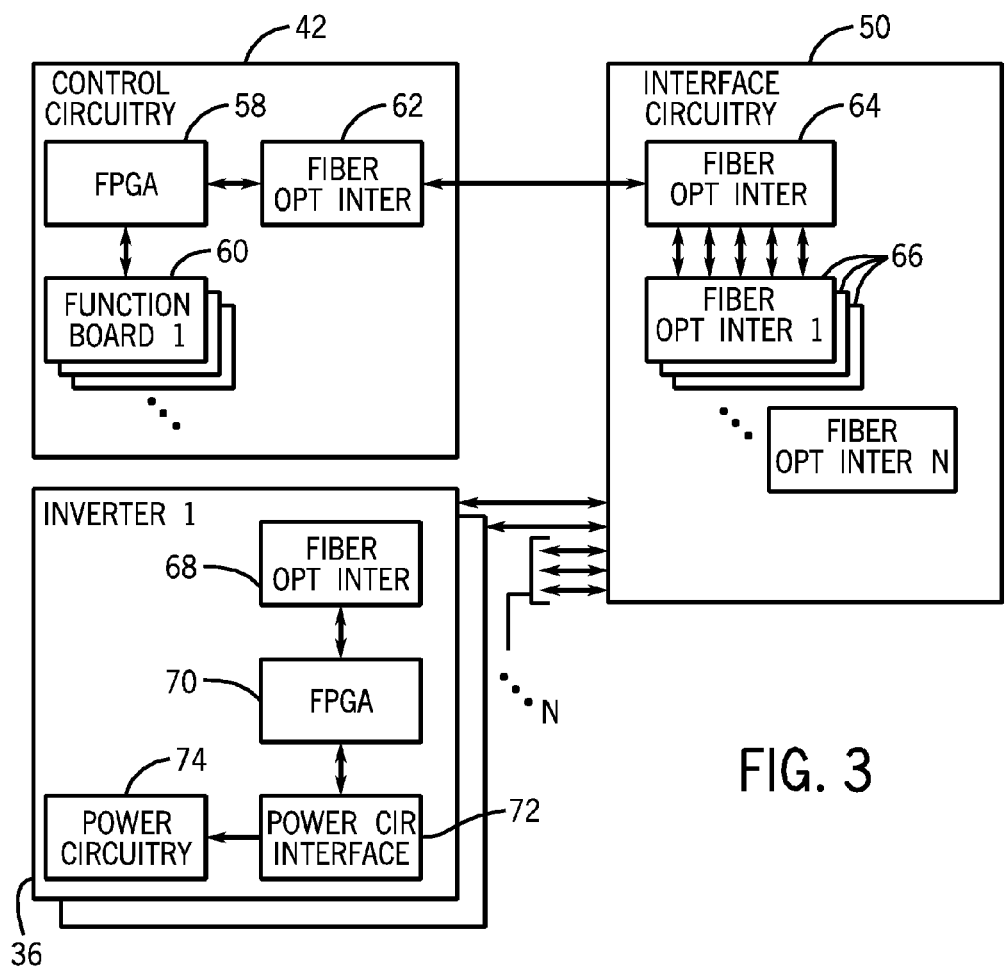
FIG. 3 is a diagrammatical representation of certain functional circuits and data exchange devices for communicating between control circuitry and power circuitry in accordance with aspects of the present technique.

FIG. 3 illustrates an exemplary manner in which certain functional components of the individual drives may be coupled to provide coordinated operation of the drives within the system. As shown in FIG. 3, the control circuitry 42 is coupled to the inverter circuitry 36 by the intermediary of optical interfaces. As indicated above, the control circuitry will include any suitable processing circuitry, such as an FPGA 58 in the embodiment illustrated in FIG. 3. This FPGA may include its own memory or separate memory may be provided (not shown). As also mentioned above, the FPGA 58 may perform various functions in cooperation with various function boards as indicated by reference numeral 60. The FPGA 58 communicates with the various inverters 36 by a fiber optic interface 62 which communicates with a mating fiber optic interface 64. This interface distributes signals to series of fiber optics interfaces 66 for the individual drives. These components, in turn, communicate with a fiber optic interface 68 at the power level of each inverter. The fiber optic interfaces 64, 66, and 68 in each of the control circuitry 42, interface circuitry 50, and inverter circuitry 36, respectively, may each include a pair of receiving (RX) and transmitting (TX) fiber transceivers. The transceivers at each interface 64, 66, and 68 may be configured to transmit and/or receive encoded signals containing both data and clock information (e.g., Manchester Encoded signals).

The circuitry at the power level will typically include a further FPGA 70 which may be provided on a common support (e.g., circuit board) with a power circuit interface 72. The support, which may be the present context termed the power layer interface, serves to receive signals from the control circuitry, to report signals (e.g., feedback signals) back to the control circuitry, to generate drive signals for the power electronic switches, and so forth. The circuitry may also perform certain functions to maintain the parallel operation of multiple connected inverters 36, such as to transmit a synchronizing signal to each of parallel inverters 36. The power circuit interface 72 may convert control signals to drive signals for driving the power circuitry as indicated generally by reference numeral 74. The power circuitry 74 will include the power electronic switches as described above.

It should be noted that in certain embodiments signal transmission between the control circuitry and the power layer circuitry may be performed over conductors other than optical fibers. For example, conventional copper or other conductors may be utilized. In such cases, the fiber optic interface discussed in connection with FIG. 3 may be omitted, and the control circuitry coupled directly to the power layer circuitry.

The particular functions of the power layer circuitry in the present context include the synchronization of communications between the control circuitry 42 and each of the parallel inverters 36. The control circuitry 42 communicates differently with the inverters 36 depending on the operational mode of the system 20. For example, the control circuitry 42 may place the inverters in an off mode, an initializing mode, or an active mode. In each of these modes, different signals may be transceived at the control circuitry 42 and/or the inverters 36. Thus, present techniques include the synchronization of communications in different operational modes of the system 20.

Figure 4:
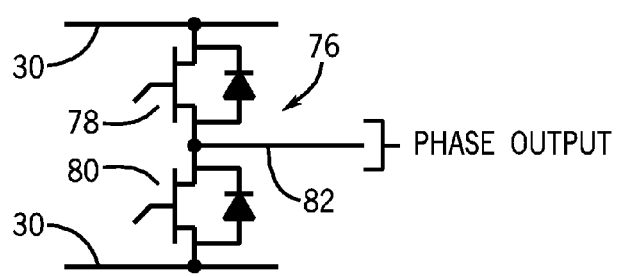
FIG. 4 is a schematic view of power electronics switches within one phase of an inverter.

Different operational modes and different functions of the power layer circuitry involve the generation of gate drive signals based upon signals provided by the control circuitry 42. That is, rather than providing gate drive signals directly from the control circuitry 42, the circuitry described herein allows for certain data to be provided to the power layers of each drive, and based upon a clock running for the FPGA in the power layer circuitry, timing signals can be generated or computed in parallel within each power layer. The timing signals serve to generate gate drive signals for the power electronic devices which will typically be arranged as illustrated in FIG. 4. That is, each phase of each inverter will include sets of switches as indicated by reference numeral 76, notably a high-side switch 78 and low-side switch 80. These power switches are coupled across the DC bus 30 and an output 82 is coupled between the high and low-side switches. The coordinated switching of the switches between conducting and non-conducting states allows for generation of a controlled output waveform on the output line 82. In practice, a number of such switches may be provided on a common support and coupled to one another to provide the desired power capacity.

Figure 5:
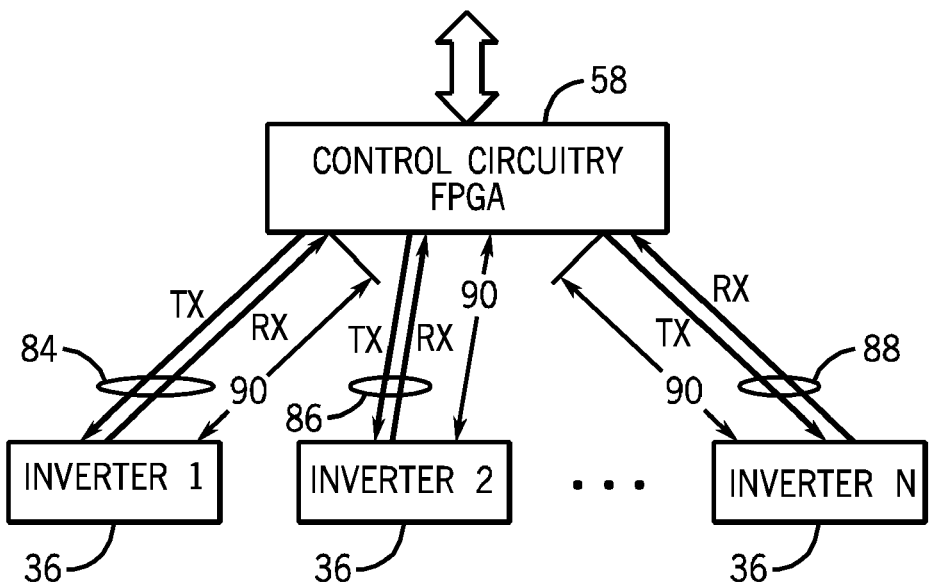
FIG. 5 is a diagrammatical view of the interchange of data between control circuitry and power layer circuitry.

FIG. 5 is a diagrammatical representation of the topology of the parallel drives and of the communications between the drives contemplated for establishing the gate drive signals for the power electronic devices at the power layer. In particular, the control circuitry FPGA 58 will provide certain data along a first, transmitting (TX) optical fiber and receive data via a second, parallel receiving (RX) optical fiber. A similar optical fiber pair indicated by reference numerals 84, 86 and 88 is provided for each inverter. The optical fiber pair transmits data and receives data in parallel for each of the inverters, such that the power layer interface circuitry within each of the inverters, and in particular the processor associated with this circuitry can recompute clock or timing information from the control circuitry FPGA without the need for the clock data being transmitted to the inverters. In a presently contemplated embodiment the lengths 90 of these optical pairs are substantially equal to reduce differences performance due to the propagation of the signals between the control circuitry and the power layer circuitry.

As will be appreciated by those skilled in the art, because the outputs of the inverters are essentially shorted, differences in switching and switch timing between the power layers of each inverter can cause circulating currents that are generally to be avoided. The arrangement illustrated in FIG. 5 and described in greater detail below allows for maintaining tight tolerances in the switching timing between the inverters, such as on the order of 20-40 ns. In a presently contemplated embodiment, data sent from the control board FPGA to the power layers of each inverter include a control status, a carrier wave increment, a deadtime value, and U, V, and W (output) phase compare values. Data provided by each power layer back to the control board FPGA includes the bus voltage, temperature, a fault status, and U, V, and W phase currents. As described below, based upon the information provided to each power layer, gate drive signals may be generated in parallel that are inherently synchronized without the overhead of transmitting a clock signal. That is, the FPGA of each power layer, operating in accordance with its own oscillator and clock, can accurately generate or recomputed timing for gate drive signals for the switches of the individual inverter in synchronicity with those of the other inverters. As described in greater detail with reference to FIGS. 6 and 7, the circuitry works, in a presently contemplated embodiment, by transferring data for synchronization that is imbedded in the data provided along the transmitting optical cable. This data allows for clock data recovery at the power layer. Moreover, a carrier waveform signal is sent from the control circuitry that facilitates the clock data recovery. Finally, a phase comparison is performed by each power layer that, in conjunction with the recovered clock data allows for synchronization of the gate drive signals.

In operation, the control circuitry sends signals to the power layer circuitry of each inverter that permits the power layer circuitry to compute or recompute timing for changing the conductive state of solid state switches in each of the respective inverters. In a presently contemplated embodiment, the computations are based upon reconstruction of a carrier waveform by reference to a recovered clock step and a triangle waveform accumulator. To permit computation or recomputation of the timing, the control circuitry sends a triangle increment signal that allows for reconstruction of the carrier triangle waveform. It also sends compare values for each of the three output phases U, V, and W. Deadtime or delay signals are also sent to allow for avoiding placing high and low switches of each inverter leg in conducting states at the same time (e.g., FIG. 3).

Figure 6:
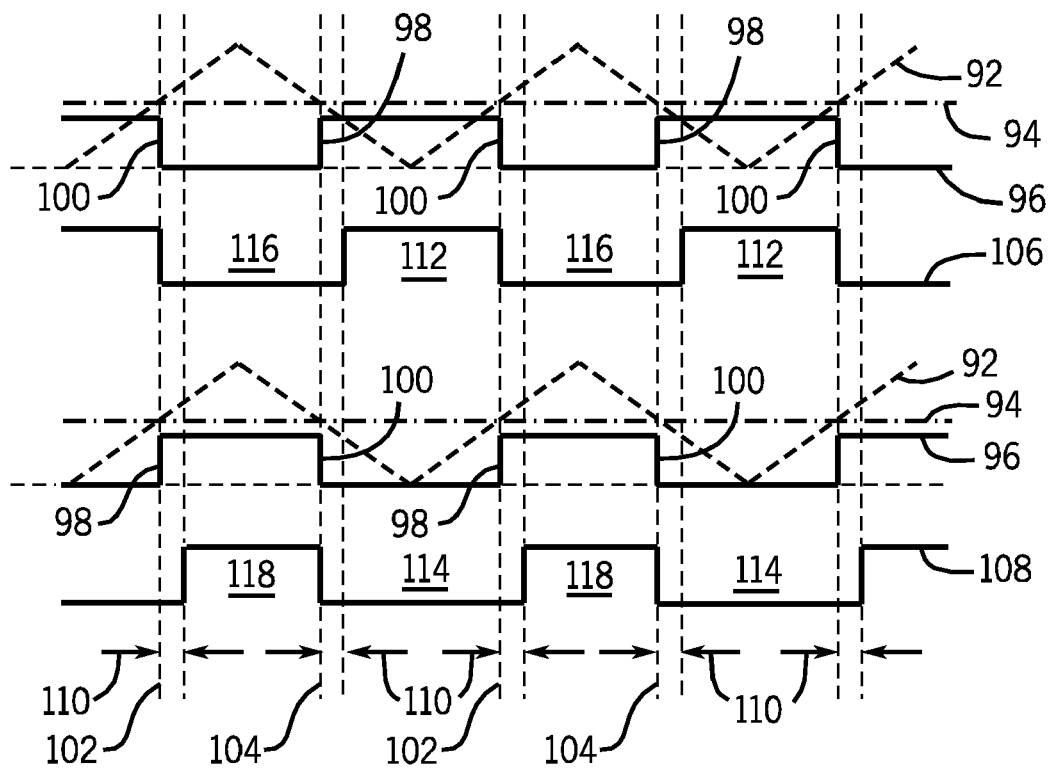
FIG. 6 is a timing diagram illustrating the recreation of gate drive signals within the power circuitry of individual inverters in accordance with aspects of the present techniques.

FIG. 6 represents exemplary timing diagrams for high and low side switches of the type illustrated in FIG. 3 for each inverter leg. It should be noted that such switching is performed for the identical legs of the parallel inverters, and similar switching is performed, although phase shifted, for the other legs of the inverters. It should also be noted that the processes described below are performed at the power layer, unlike existing topologies that may perform similar processing for generating of gate drive timing at the level of the control circuitry. Certain aspects of the computations themselves may be substantially similar to those described in U.S. Pat. No. 5,917,721, entitled "Apparatus for Reducing the Effects of Turn on Delay Errors in Motor Control" and issued to Kerkman et al. on Jun. 29, 1999; U.S. Pat. No. 5,990,658, entitled "Apparatus for Controlling Reflected Voltage on Motor Supply Lines" and issued to Kerkman et al. on Nov. 23, 1999; and U.S. Pat. No. 7,738,267, entitled "Systems and Methods for Common-mode Voltage Reduction in AC Drives" and issued to Tallam et al. on Jun. 15, 2010; and U.S. Pat. No. 7,342,380, entitled "System and Method for Adjustable Carrier Waveform Generator" and issued to Kerkman et al. on Mar. 11, 2008, all of which are hereby incorporated into the present disclosure by reference.

As shown in FIG. 6, a triangular carrier wave 92 is recomputed in each of the power layer interface circuits based upon information received from the control circuitry. The rate of change or slope of the triangular carrier waveforms depends upon the step increment for the waveform and a recovered clock signal. Recomputation of the carrier wave signal is discussed below with reference to FIG. 7. The triangular carrier wave is crossed by a phase count line as indicated by reference numeral 94 in FIG. 6. This phase count line allows for the duty cycle of the solid state switches to be altered as it is raised or lowered to change its points of intersection with the carrier wave. Shifting of the vertical location of the phase count 94 is provided by the phase compare values transmitted from the control circuitry to the power layer interface circuitry. The points of intersection lead to computation of phase comparator outputs as indicated by reference numerals 96 in FIG. 6. In FIG. 6, the timing of the upper solid state switch in a pair is illustrated in the upper portion of the diagram, where as timing for a lower solid state switch in a pair is indicated in the lower section of the diagram. It should be noted that for both the upper switch and the lower switch, the comparator output 96 is generally identical but inverted. The intersections of the phase count line and the carrier wave produce rising edges 98 and falling edges 100 in each of these comparator outputs at times 102 and 104, with the rises and falls in the upper and lower switches being opposite to one another.

In the embodiment illustrated in FIG. 6, moreover, deadtimes or delays are taken into account in conjunction with the phase comparator output to produce upper switch drive timing and lower switch drive timing, indicated by reference numerals 106 and 108, respectively. That is, the control circuitry transmits a deadtime or delay signal to the power layer circuitry that causes the OFF or non-conducting period of the upper and lower switches to be extended and the ON or conducting period to be reduced, thereby avoiding placing both switches in a conductive state simultaneously, a condition that could lead to "shoot-through" of current. This delay, indicated in FIG. 6 by reference numeral 110, results in the computed timing providing for periods in which the switches are in conducting and non-conducting states to produce pulse width modulated signals that are applied to the gates of the solid state switches. That is, as shown in FIG. 6, period 112 represents the period in which the upper switch is conducting, while reference numeral 114 represents the period in which the lower solid state switch is non-conducting. It may be noted that the deadtime allows for the upper switch to be placed in a non-conducting state before the lower switch is shifted to a conducting state. Reference numeral 116, then, represents the period in which the upper solid state switch is a non-conducting state, while reference numeral 118 represents the period in which the lower solid state switch is in a conducting state. Here again, the deadtime allows for avoiding both switches conducting at the same time. These timing signals are then applied to gates to control the energization of the solid state switches in a conventional manner. It should be noted, however, that if the deadtime does not change, the value used for this parameter may be sent less often or upon initialization of the circuitry, and need not be sent repeatedly by the control circuitry. Moreover, if the deadtime is fixed, some embodiments may simply store the deadtime value in the power layer circuitry.

Figure 7:
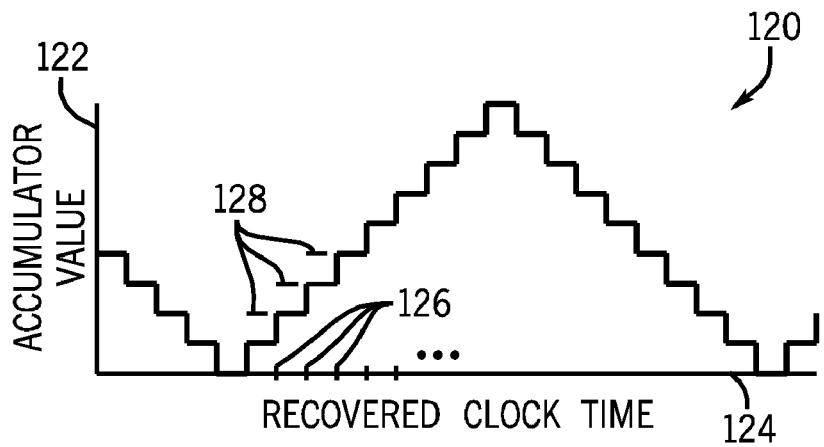
FIG. 7 is a graphical representation of clock recovery within the power circuitry following the signal timing illustrated in FIG. 6.

FIG. 7 represents an exemplary technique for recomputing the triangle waveform through the use of an accumulator in the power layer interface circuitry. The diagram of FIG. 7 illustrates a carrier waveform counter 120 that would correspond to the carrier wave 92 of FIG. 6. The counter waveform is illustrated as defined by an accumulator value 122 and a recovered clock time 124. The clock time is divided into time increments 126 and the carrier counter is then computed based upon an accumulated time step 128. The triangle increment for this carrier counter is transmitted from the control circuitry to the power layer circuitry of each inverter.

It should be noted that the signals transmitted from the control circuitry to the power layer circuitry of each inverter are sufficient to recompute the carrier wave and the timing signals, thus allowing each inverter, independently and in parallel, to recompute the timing signals with high fidelity. In a presently contemplated embodiment, for example, deviations between timing of the inverters do not exceed approximately 40 ns, and in certain embodiments may not exceed approximately 20 ns. Synchronization pulses may be sent periodically from the control circuitry to the power layer interface circuitry to re-establish synchronicity between the clocks. That is, in the event that the oscillators of the processors for the power layer interface circuitry do not operate at the same rates, any variation may be periodically (e.g., every 250 μs) corrected by the use of synchronization pulses. Nevertheless, the ability to recompute the timing signals at the power layer circuitry enables paralleling of the inverters while significantly reducing circulating currents.

Figure 8:
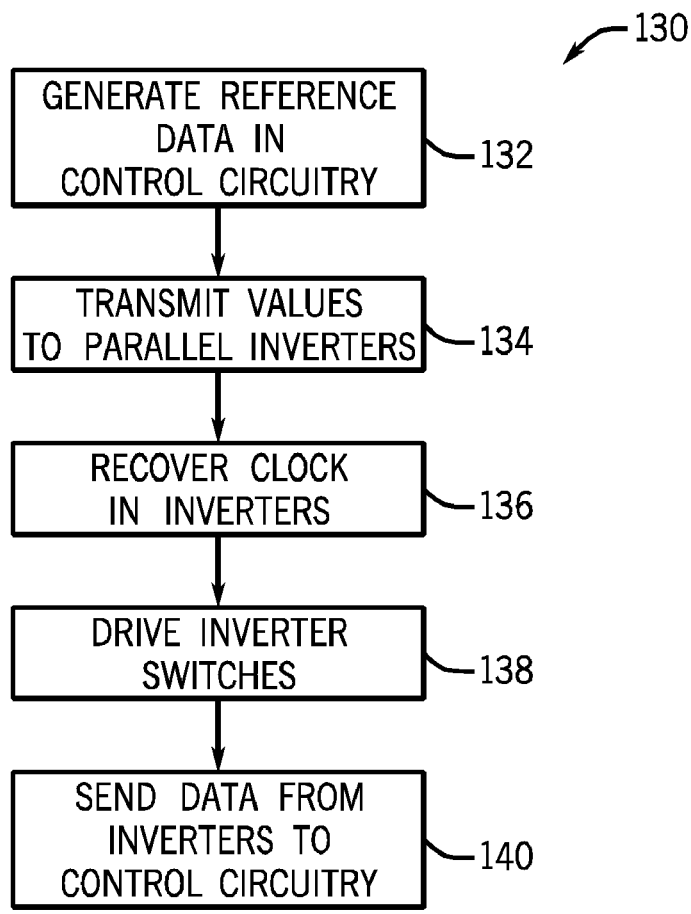
FIG. 8 is a block diagram illustrating exemplary logic for coordinating operation of the power circuitry in parallel drives.

FIG. 8 represents exemplary logic for carrying out these operations. The logic, designated generally by reference numeral 130 in FIG. 8, begins with generating reference data in the control circuitry, as indicated by step 132. This reference data will typically include the timing or data that can be used to compute the timing, including, in a present embodiment, the carrier triangle waveform increment, U, V, and W phase compare values, and a deadtime or delay value. As indicated at step 134, then, these values are transmitted in parallel to the inverters, and particularly to the power layer interface circuitry. As indicated at step 136, the clock timing is recovered in the inverters as indicated in FIG. 7, based upon the clock interval of the power layer interface circuitry and the triangle increments. At step 138, then, the timing signals are reconstructed in the power layer interface circuitry and pulse-with modulated signals are generated for driving the solid state switches of each of the inverters. At step 140, signals may be sent from each inverter back to the control circuitry. As noted above, in a presently contemplated embodiment, such information may include U, V, and W phase currents, bus voltages, temperatures, false status, and so forth.

As noted above, the foregoing process allows for accurate synchronization of switching of parallel-coupled inverters having a common control circuit in common three-phase output. The waveform, or data used to recompute the waveform, is generated by the control circuitry FPGA and is mirrored by identical waveforms in the power layer FPGAs. Such recomputation of the timing signals facilitates control task interrupt generation simplifies transmission of information between the control circuitry and the power layer circuitry, and allows for drive-to-drive synchronization (e.g., via IEEE-1588) where desired. Such drive-to-drive synchronization may be performed as disclosed in U.S. published patent application no. 20100123425, entitled "Motor Drive Synchronization System and Method," and filed by Campbell et al. on Nov. 17, 2008, which is hereby incorporated into the present disclosure by reference.

Figure 9:
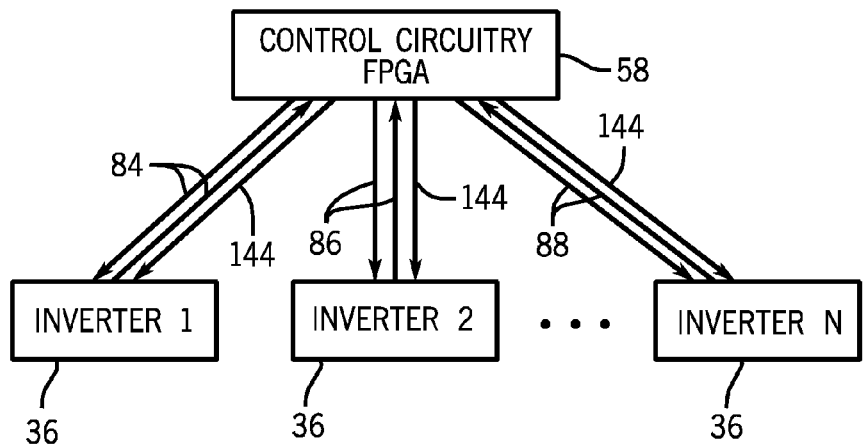
FIG. 9 is a diagrammatical representation of an alternative embodiment in which a clock signal conductor is provided for transmitting a clock signal.

In certain embodiments, it is also contemplated that a further optical conductor may be provided between the control circuitry and each power layer interface over which a clock signal could be transmitted. FIG. 9 illustrates diagrammatically a system of this type. As discussed above, each inverter 36 may be coupled to the control circuitry via parallel serial cables which include a pair of optical fibers. A third optical fiber 144 could be provided over which a clock signal is provided to each power layer interface from the control circuitry. The provision of this clock signal may obviate the need for clock recovery through recomputation of the triangular waveform as illustrated in FIG. 7. The recomputation of the timing signals could, thus, be performed in synchronicity based upon the transmitted clock signals.

Figure 10:
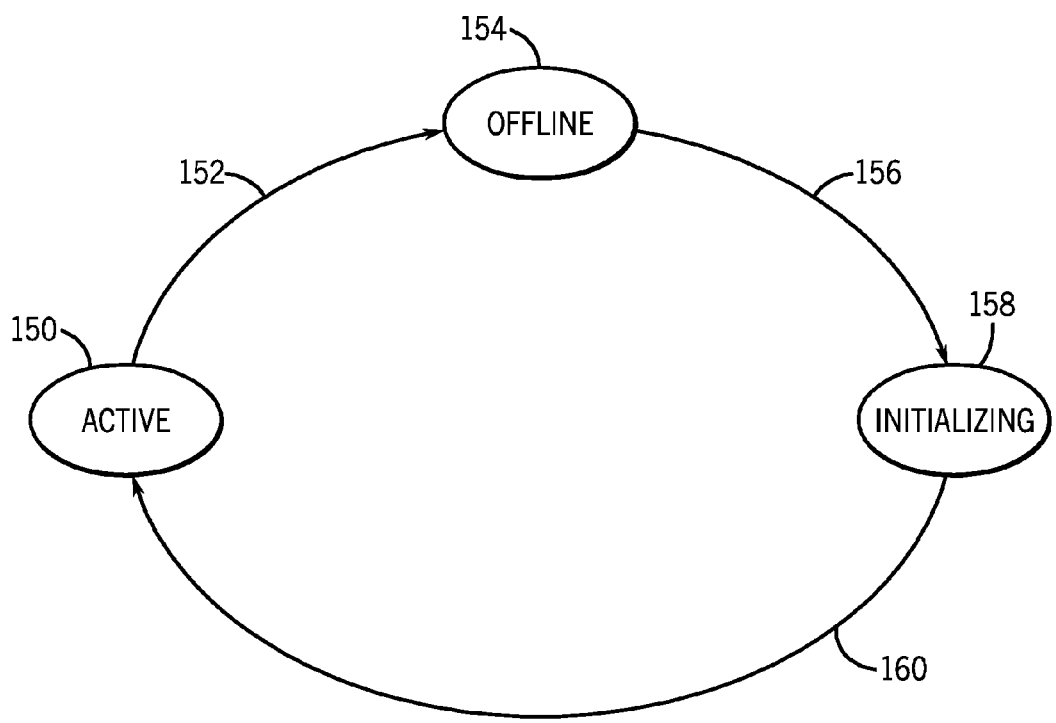
FIG. 10 is a diagrammatical representation of operational modes of the motor drive system.

As noted above, the common control circuitry allows for synchronizing parallel inverters 36 for different modes of operations (i.e., changing the conductive state of IGBT's in a coordinated fashion). The communications between the control circuitry 42 and the inverters 36 generally described above may differ depending on a mode of operation of the system 20. For example, the control circuitry 42 may request the inverters 36 to operate in three general modes of operation, including an off mode, an initializing mode, and an active mode. FIG. 10 illustrates an operational state machine of the system 20, which includes the three modes of operation. During the active mode 150, the control circuitry 42 may send signals including data, clock information, and synchronization pulses, through a fiber optic pair 84 to the power layer circuitry of each inverter 36. Timing information may be computed to generate gate drive signals in the inverter 36, according the techniques described above. The control circuitry 42 may shut down the switching of the inverters 36 by sending a power down signal 152 to change to a state of the system into an off mode 154. The off mode 154 may be the default mode where inverter switches 54 are reset to a default state (typically non-conducting). In some embodiments, power down data may be transmitted from the inverters 36 to the control circuitry 42 during the off mode 154. Such power down data may include, for example, information regarding the power cycle of the previous active mode, system register information, or data corresponding to the elapsed life of system components during the previous active mode (e.g., motor bearing, machine bearing, fans, buses, etc.).

Before the inverters 36 return to an active mode 150 from an off mode 154, the inverters 36 generally enter an initializing mode 158. The state may change 156 to an initializing mode 158 after the control circuitry 42 has received the power down data from the inverter 36. During the initializing mode 158, the control circuitry 42 and the inverters 36 may exchange information corresponding to identification, revision, and manufacturing data, or any other data used to define the particular inverter 36 that is connected to the control circuitry 42. The state may change 160 once the information is received at the control circuitry 42, and the system 20 may once again operate in an active mode 150.

Figure 11:
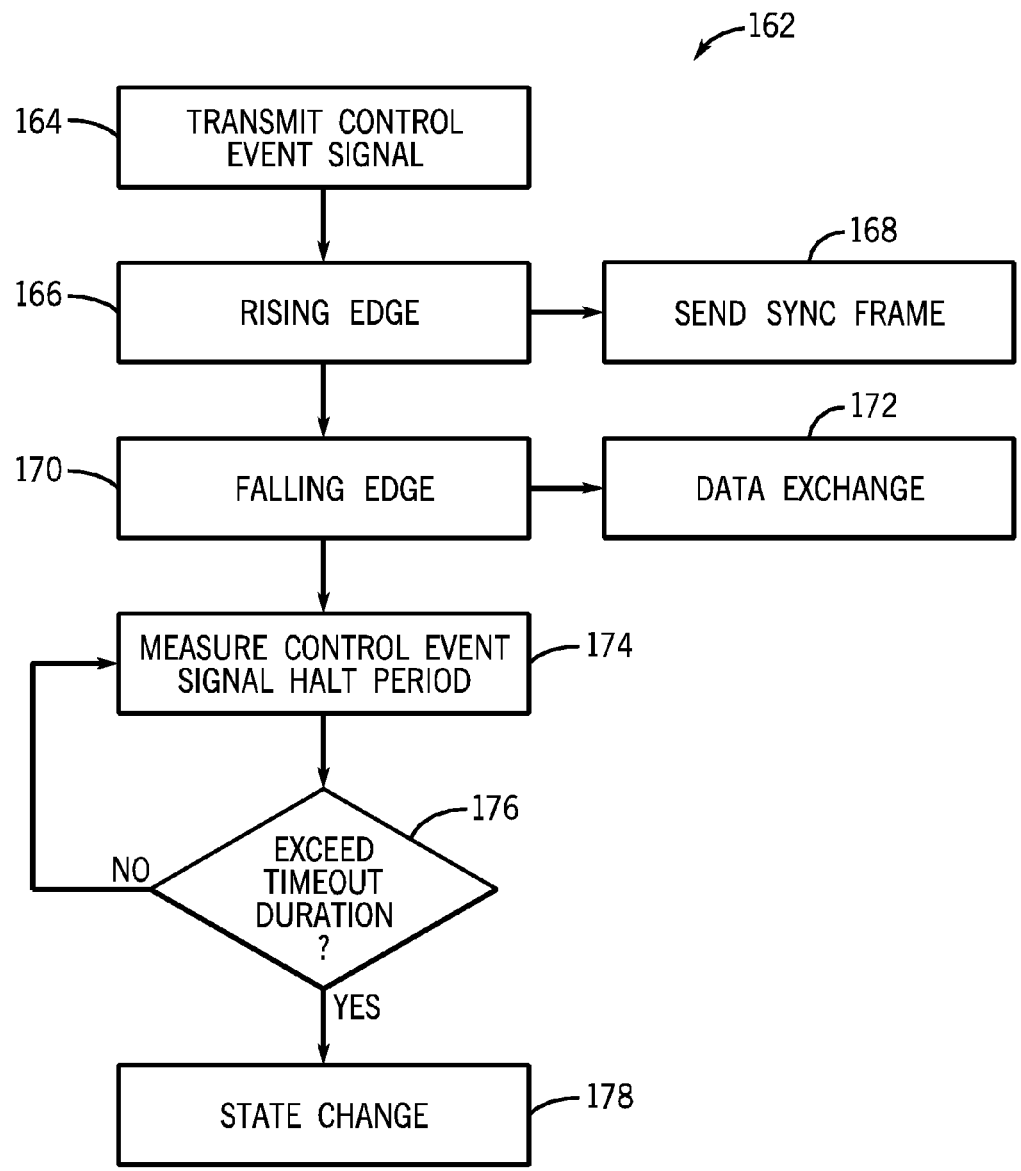
FIG. 11 is a flow chart of a communications protocol between control circuitry and the power layer interface circuitry of the multiple parallel motor drives.

In each of the operational modes, FIG. 11 provides a flow chart which generally summarizes the communications protocol 162 between the control circuitry 42 and the inverter 36 for different modes of operation. The control circuitry 42 transmits a control event signal 164 which in a presently contemplated embodiment includes a Manchester encoded signal with embedded data and clock information. Manchester encoded signals are generally transmitted as a data bit stream with no DC component. A clock signal can be recovered from the signal by, for example, the FPGA 70 of the power layer circuitry of each inverter 36. At the rising edge 166 of the signal, a synchronization pulse 168 may be transmitted to insure that each of the parallel inverters 36 is synchronized with others. At the falling edge 170 of the signal, data exchange 172 may occur. During data exchange 172, different types of data may be transmitted and received between the control circuitry 42 and each parallel inverter 36, depending on the mode of operation (e.g., offline mode 154, initiating mode 158, active mode 150) in which the system 20 is operating. The different types of data exchanged will be further discussed with respect to FIG. 12.

Data exchange may occur until all data is exchanged. The control circuitry 42 may measure (block 174) a halt period of the data exchange. A halt period refers to a period of time in which no clock signals are output, which may indicate that data exchange is complete for the current operation. The control circuitry 42 may determine (block 176) whether the halt period exceeds a timeout duration. If the halt period does not exceed a threshold timeout duration, the control circuitry 42 may continue to measure the halt period and maintain the current operation. If the halt period exceeds a threshold timeout period, a state change 178 may occur. For example, the system 20 may change from an offline mode 154 to an initiating mode 158, from an initiating mode 158 into an active mode 150, or from an active mode 150 into an offline mode 154.

Figure 12:
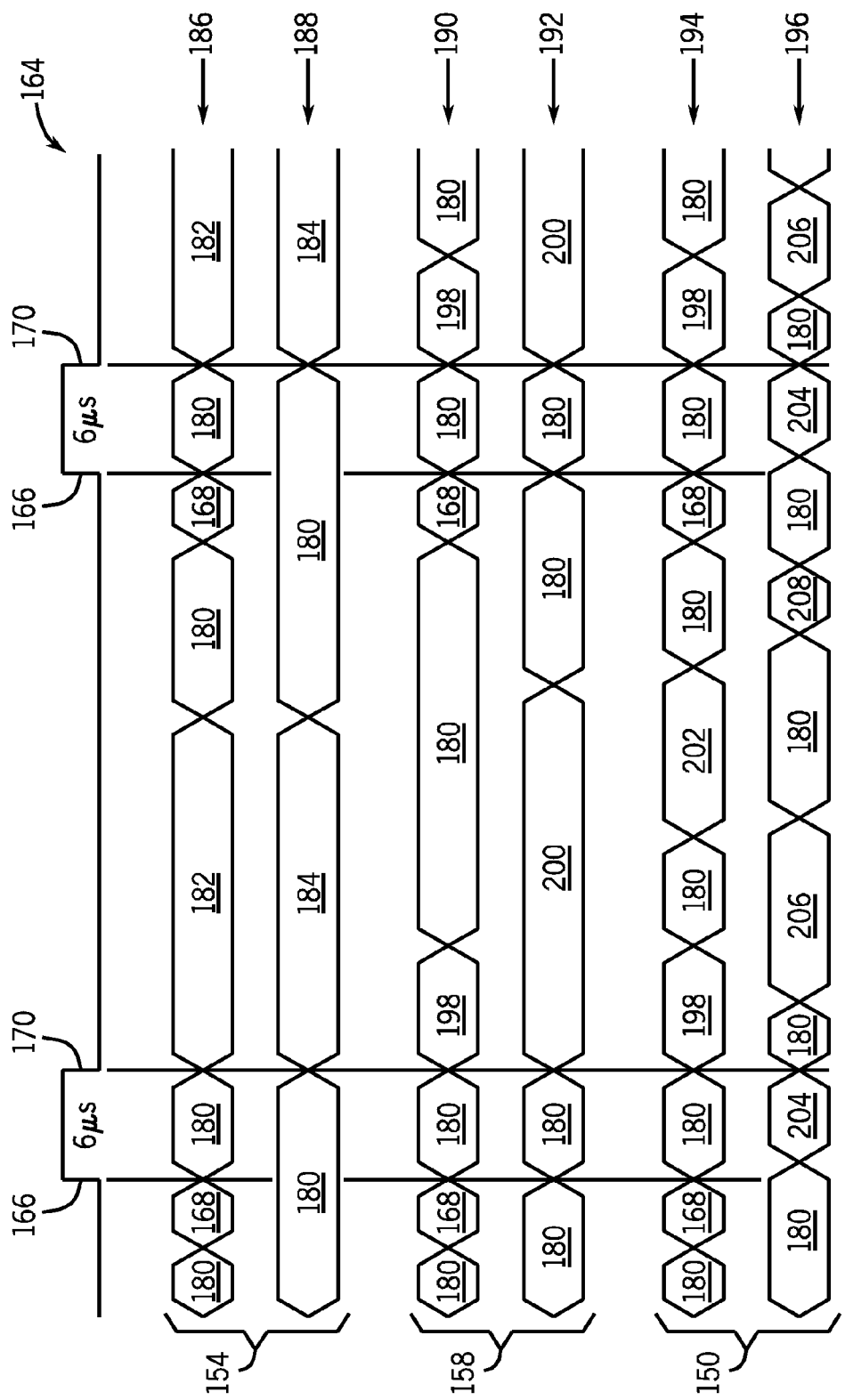
FIG. 12 is a series of timing diagrams representing data exchanges for different operational modes with respect to a control event signal.

A more detailed description of synchronized operation in the three different operational modes is provided in the timing diagrams of FIG. 12. Specifically, FIG. 12 illustrates data exchange which is transmitted from or received at the control circuitry 42 with respect to a control event signal 164 generated at the control circuitry 42. Beginning first with the offline mode 154, the control circuitry 42 may be configured to receive off mode signals 186 and transmit off mode signals 188. Before the rising edge 166 of the control event signal 164, the control circuitry 42 may transmit a synchronization pulse 168. The synchronization pulse 168 is transmitted to all parallel inverters 36 to synchronize all parallel inverters 36 with respect to each other. The control circuitry 42 may not receive or transmit (as indicated by the idle periods 180) until the falling edge 170 of the control event signal 164. After the falling edge 170 of the control event signal 164, the control circuitry may simultaneously transmit and receive power down data 182 and power up data 184. The power down and power up data 182 and 184 may include information corresponding to the power cycle of the previous active mode, system register information, or data corresponding to the elapsed life of system components during the previous active mode (e.g., motor bearing, machine bearing, fans, buses, etc.). Such information may be used such that the control circuitry 42 can accumulate data before a subsequent power down into the off mode 154. A sufficiently long idle period 180 following the completion of the power up and power down 182 and 184 data transfer may result in a change of state into the initializing mode 158.

In the initializing mode 158, the control circuitry 42 may by configured to receive initializing mode signals 190 and transmit initializing mode signals 192. Before the rising edge 166 of the control event signal 164, the control circuitry 42 may transmit a synchronization pulse 168 and may not receive or transmit (as indicated by the idle periods 180) until the falling edge 170 of the control event signal 164. After the falling edge 170 of the control event signal 164, the control circuitry may transmit thermal parameter data 198 to the parallel inverters 36. The thermal parameter data 198 may include parameters used by a thermal manager in the control circuitry 42 which controls the temperature of the inverters 36 for various modes of operation. For example, during an initializing mode 158, the thermal parameter data 198 may set the inverters 36 to a temperature suitable for transmitting identification data, which may include system status information, identification number, and manufacturing information such as assembly number or revision, serial number, date, etc. The identification data 200 may be received at the control circuitry 42. A sufficiently long idle period 180 following the completion of the identification data 200 received at the control circuitry 42 may result in a change of state into the active mode 150.

In the active mode 150, the control circuitry 42 may by configured to receive active mode signals 194 and transmit active mode signals 196. Before the rising edge 166 of the control event signal 164, the control circuitry 42 may transmit a synchronization pulse 168 to the power layer circuitry of each of the parallel inverters 36. In response to the synchronization pulse 168, the inverters 36 may compute feedback data 204 associated with data acquisition in the active mode. The feedback data 204 may include information regarding the bus voltage and the current values at each of the three phases of the parallel inverters 36. Such feedback information may indicate to the control circuitry 42 whether the inverters 36 can properly accept data in the active mode 150. In some embodiments, the falling edge 170 of the control event signal 164 may occur approximately 6 μs following the rising edge 166 in each sync cycle. The feedback data 204 may be transmitted from the inverters 36 to the control circuitry 42 within the 6 μs interval. In a present embodiment, the individual power layers acknowledge reception of the data from the control circuitry. If all power layers acknowledge reception, then a followup message ("use PWM data") is sent to all power layers. If that message is not received by each of the power layer circuitry, then all power layers utilize the previous control data for controlling their respective switches.

The control circuitry 42 may not transmit (as indicated by the idle periods 180) until the falling edge 170 of the control event signal 164. After the falling edge 170 of the control event signal 164, the control circuitry may transmit thermal parameter data 198 to the parallel inverters 36. Such thermal parameter data 198 transmitted in the active mode 150 may control the temperature of the inverters 36 to a suitable temperature for active mode operation 150. The inverters may return thermal feedback data 206 in response to the thermal parameter data 198 transmitted by the control circuitry 42 and received at the inverters 36. The thermal feedback data 206 received at the control circuitry 42 may indicate that the inverters 36 are prepared to receive control data 202. The control data 202 may include pulse width modulated data which may be addressed to the U, V, and W phases of each inverter 36. Further, the control data may have embedded clock signals in the form of the previously discussed triangular carrier waves which may be used to recompute timing at each inverter 36. In some embodiments, the inverters 36 may transmit an acknowledge signal 204 to the control circuitry 42. The acknowledge signal 204 may indicate that the control data 202 was received correctly at the inverter 36. Receiving the acknowledge signal 204 from all parallel inverters 36 may insure that all inverters 36 accurately received the same control data 202. In one embodiment, if one inverter 36 does not acknowledge that valid data 202 was received, the control circuitry 42 may use the same data in the next synchronization frame for all parallel inverters 36, thus maintaining synchronous operation of the parallel inverters 36. A sufficiently long idle period 180 following the completion of the transmitted control data 202 and/or the acknowledge signal 208 may result in a change of state into the active mode 150.

It should be noted that the timing diagrams illustrated in FIG. 12 have approximate time durations for all represented events. The timing diagram serves only to illustrate when data transfers approximately occur with respect to the control event signal 164. For different functions in each mode of operation, data transfers may take different amounts of time. Furthermore, in some embodiments, additional operational modes may exist. Additionally, while idle periods 180 are indicated throughout the diagrams corresponding to each operational mode, in some embodiments, such idle periods may not be necessary in actual operation and serve only to separate different data transfer events for the purpose of explanation.

As discussed above, a synchronization pulse 168 is transmitted to the power layer circuitry of each of the parallel inverters 36 approximately every 250 μs to synchronize the operation and data transfer for each of the parallel inverters 36. Due to the parallel operation of multiple inverters 36 and the high data stream rate of approximately 66 MHz, drifts or differences in pulse frequencies from oscillators in the processing circuitry of the power layer circuitry may cause, over time, a loss of synchronicity between synchronization pulses. For example, the frequency of the recovered clock signals may be slightly different between the control circuitry 42 and the power layer circuitry of each inverter 36. Furthermore, with parallel inverters 36 in the system 20, asynchronous clock recovery is even more likely to occur, particularly when variability is present in the frequency of the processing circuitry oscillators. Uncorrected asynchronous clock recovery, even between synchronization pulses occurring at a 250 μs interval, may result in errors in the operation of one or more inverters 36 which may eventually affect the performance of the entire system 20 (e.g, by causing circulating currents).

Therefore, the present embodiments also address the synchronization of clock recovery at the power layer circuitry of each parallel inverter 36 during data transfer between the synchronization pulses 168. In a present embodiment, a data stream rate of approximately 66 MHz is used for the power layer clocks, and the synchronization of data transfer between synchronization pulses 168 may utilize an approach, including Manchester encoding, for example, which allows a comparatively deterministic sampling of the data stream transmitted by the control circuitry. The sampling of the transmitted data may be used to adjust for drift or frequency differences in the oscillation rates within each power layer circuit, allowing for correction recovered clock timing. One or more embodiments of such an approach are explained in FIGS. 13 and 14.

Figure 13:
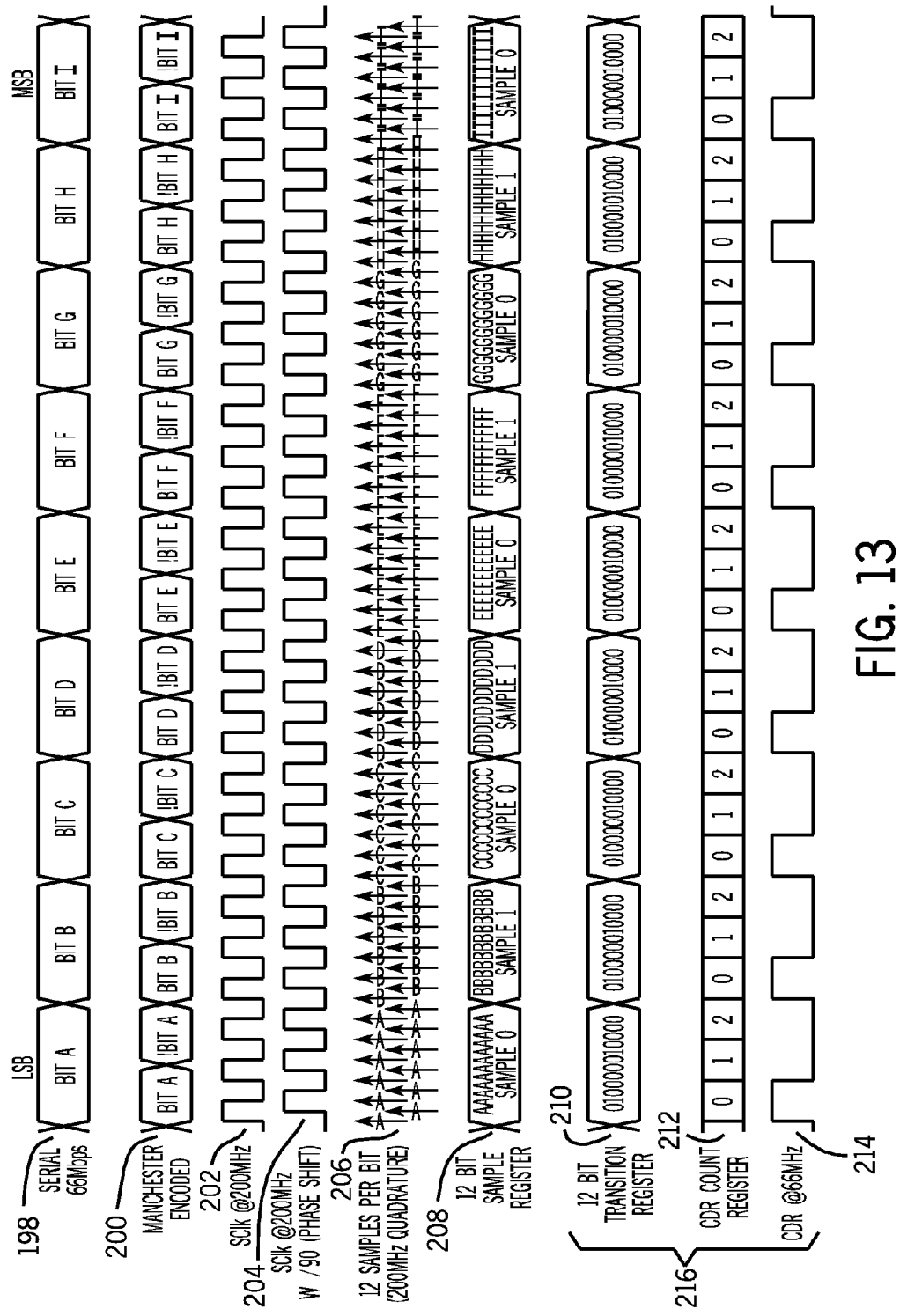
FIG. 13 is a series of timing diagrams representing a method of clock recovery which maintains synchronous data transfer.

FIG. 13 illustrates several timing diagrams which explain an embodiment for adjusting for oscillator rates in synchronizing clock recovery at the power layer circuitry of each inverter 36. The data stream 198 represents the data transferred from the control circuitry 42 to the power layer circuitry of each inverter 36. As discussed above, the data stream 198 may be Manchester encoded, resulting in the Manchester encoded stream 200. The Manchester encoded stream 200 may have twice the rate of the serial data stream 198 owing to the division of the data by insertion of mid-bit. For example, the Manchester encoded stream may have a frequency of approximately 133 MHz, such that two data bits (referred to as Manchester bits) are transmitted in the Manchester encoded stream 200 for every data bit in the serial data stream 198. The Manchester encoded stream 200 may therefore have a transition in the middle of each data bit, which increases the detectability of the edges of each data bit for improved clock recovery by the power layer circuitry.

The power layer circuitry of each inverter 36 includes an oscillator configured to produce a signal for sampling the received Manchester encoded stream 200. In a present embodiment, the oscillator may have a frequency of approximately 200 MHz, as indicated by the sampling clock signal 200. In practice, FPGA logic may limit the frequency of the sampling clock signal, and although faster oscillators may be used, such devices may be increasingly costly as the oscillator frequency is increased. However, in some embodiments, higher sampling rates may be obtained by phase shifting the sampling clock signal 200, and quadrature sampling by using both rising and falling edges of both pulse trains. All such sample triggers are then used to sample concurrently, effectively quadrupling the sampling frequency (based on 4 edges per cycle). The oscillator may input the sampling clock signal 200 into circuitry configured to shift the phase of the sampling clock signal 200 by 90°. In the illustrated embodiment, this phase shifted sampling clock signal 202 is used concurrently with the sampling clock signal 200, along with quadrature sampling to provide an effective sampling rate of 800 MHz and thereby to retrieve 12 samples of each data bit (at 1.25 ns in a 15 ns interval), as represented by the samples 206. The samples 206 correspond with either a rising edge or a falling edge of either the sampling clock signal 200 or the phase shifted sampling clock signal 202. Although the 12 sampled bits (referred to as sample bits) correspond with the size of one data bit in the serial data stream 198 provided in this example, different sample sizes, oscillator frequencies, clock frequencies and sample rates may also be used in other embodiments.

The recovered data stream at the power layer circuitry of each parallel inverter 36 is represented in the recovered data stream 208. To maintain synchronous clock and data recovery, the power layer circuitry may implement a transition register 210 which may include a 0 or a 1 for each sample bit of each data bit. As illustrated, the transition register 210 for the 12 bit sampling method currently described may have 12 sample bits of 0s and 1s, with each 1 representing an edge of a Manchester bit in the Manchester encoded stream 200. Circuitry in the power layer of each parallel inverter 36 may track the position of a sample bit (e.g., the Manchester encoding mid-bit) to verify that the position of the sample bit does not drift, which may indicate a drifting of the oscillator. In general, if no drifting is taking place, the bit should occur in the same position in the sampling register for each cycle. If the oscillator frequency is faster or slower than the design frequency, the position of the monitored bit may move (e.g., occur more or less frequently in an $11^{th}$ or $13^{th}$ position, rather than a $12^{th}$ for a sampling rate of 12 per cycle). For example, as illustrated in the transition register 210, if the oscillator is operations precisely as shown (which is not likely), the second 1 is always occur in the same position within each bit. A further 1 would then be expected 12 sample bit positions from the first 1, assuming again 12 samples per bit. Drifting of the second 1, as will be further explained with respect to FIG. 14, may indicate that the oscillator at the power layer circuitry of the particular inverter 36 is operating asynchronously. That is, if the oscillator has a frequency other than the design frequency, the differences in the number of samples between transition bits will ultimately occur, and at rates that may differ depending upon how differently the oscillator rate differs from the design rate.

The power layer circuitry may manage the clock data recovery by utilizing a clock data recovery (CDR) count register 212. By inputting 0, 1, or 2 into the CDR count register 212, the power layer circuitry can set the clock cycle of the recovered clock signal, or the CDR signal 214. As illustrated, each rising edge of the CDR signal 214 corresponds to a 0 or reset in the CDR count register 212, and each falling edge of the CDR signal 214 corresponds to a 1 in the CDR count register 212. The CDR count register 212 may use a repeated sequence of 0, 1, and 2 to generate the CDR signal 214 when no drifting is detected in the transition register 210. The situation represented by the transition register 210, the CDR count register 212, and the CDR signal 214 may be referred to as synchronous operation 216.

Figure 14:
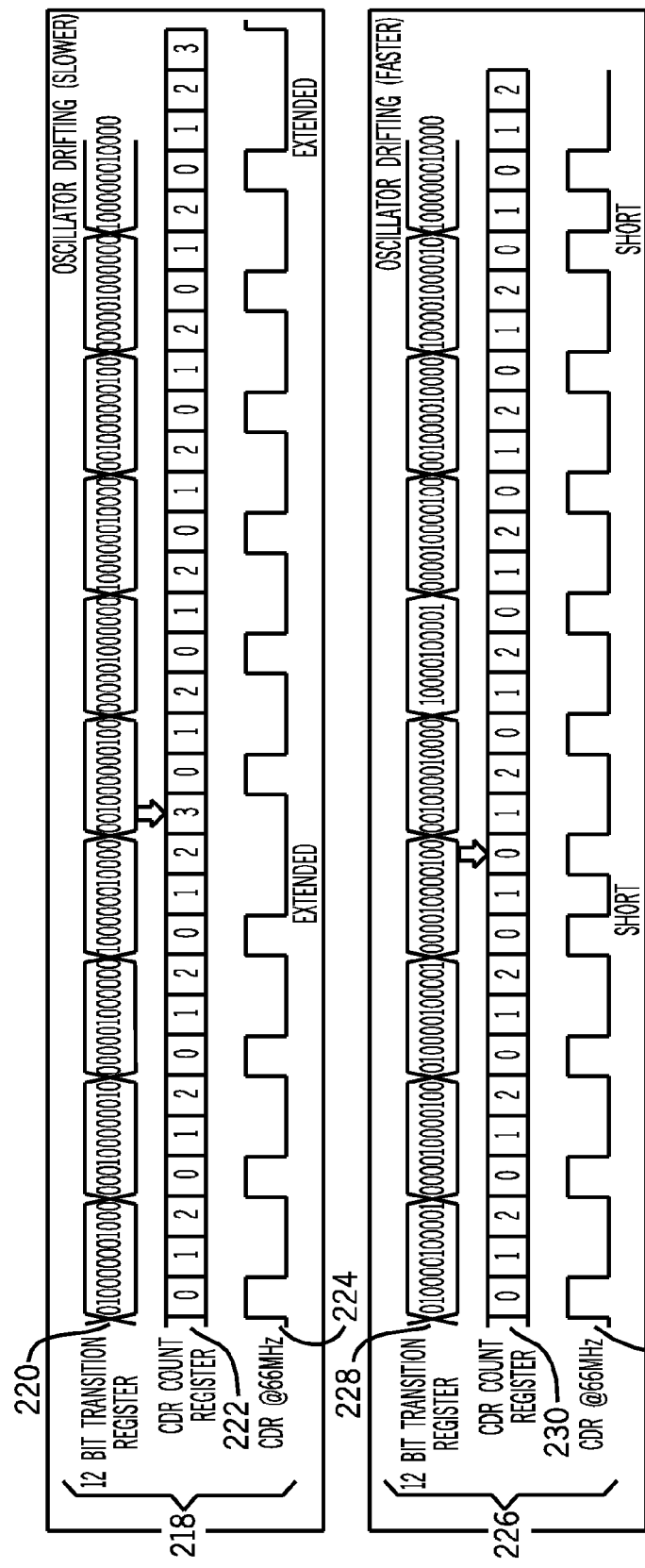
FIG. 14 is a series of timing diagrams comparing oscillator drifts which are corrected to maintain synchronous data transfer.

Variation or drifting from the synchronous operation 216 mentioned above is represented in the timing diagrams of FIG. 14. Specifically, the timing diagrams of FIG. 14 illustrate of an oscillator in the power layer circuitry of a parallel inverter 36 operating too slowly, as indicated by reference numeral 218 and too fast, as indicated by reference numeral 226. In the case of an oscillator running at a rate slower than the design rate, the position of the transition bits or is drifts backwards. In the illustration 218, a particularly fast drift is shown, with 13 samples between transitions whereas a design rate would call for 12. In practice, much slower drifts may be expected. That is, as shown in the transition register 220, the position of the is shift at each bit register, and the position of the second 1 is 13 sample bits away from the first 1 (in contrast with the 12 sample bit difference in the synchronous operation 216 of FIG. 13). The power layer circuitry recognizes the situation as a drifting of the oscillator, and corrects the effects of the drift by subtracting a clock cycle. For example, in the illustrated embodiment, when the number of samples between transition bits is detected to be too high, the power layer circuitry may insert a 3 (an additional cycle count) into the CDR count register 222, as indicated by the arrow, out of the regular order to delay the rising edge of the CDR signal 224. That is, in this case the oscillator is detected as sampling at too low a frequency, and an extension or additional step in the count is used to at least partially correct for the accumulating difference. In a presently contemplated embodiment, the correction is made when comparison of the number of samples between transition bits indicates that differences between the number of samples and the design number have occurred 3 times. This threshold may be higher or lower, however, depending upon the precision desired in the corrections.

In the event of a drift in the opposite sense, as indicated by reference numeral 226, the position of the is drift forward in each cycle (here again a particularly fast drift is illustrated). As shown in the transition register 226, the position of the is shift at each bit register, and the position of the second 1 is 11 sample bits away from the first 1 (in contrast with the 12 sample bit difference in the synchronous operation 216 of FIG. 13). The power layer circuitry recognizes the situation as a drift to too high a sampling rate of the oscillator, and corrects the effects of the drift by adding a clock cycle. For example, the power layer circuitry may insert a 0 into the CDR count register 230, as indicated by the arrow, out of the regular order to instruct the rising edge of the CDR signal 232 to be reset sooner than the previous period, thereby at least partially correcting for the accumulated error. Here again, in the presently contemplated embodiment, the correction is made when a three errors are detected, although higher or lower thresholds may be used. As in the previous case, these thresholds may be varied based upon the clock data recovery source frequency and the accuracy of the clock correction desired.

Therefore, the Manchester encoded signal 200 and the 12 bit sample rate enables the power layer circuitry of each parallel inverter 36 to track the position of the data signal edges in a transition register and to detect the position of data signal edges relative to another edge in the same register bit. Such techniques enable the detection of asynchronous operation such that the power layer circuitry can appropriately subtract or add a clock cycle (e.g., a 5 ns increment in the present embodiment) to synchronize either a slow drift or a fast drift, respectively. The system thus effectively uses the sampled signals, and particularly the transitions in the sampled bits, as a reference for detecting and correcting for variations in the oscillator frequencies. In the illustrated embodiment the technique has been shown to provide gate switching differences between inverters (or between the clock rate of the control circuitry and any single power layer) of approximately 20 ns (24 ns in a present embodiment), while a difference of approximately 40 ns would have been deemed sufficient to avoid circulating currents.

While the foregoing techniques have been described in the context of parallel inverters, it should be noted that the same techniques could be used when controlling the operation or switching of a single inverter. That is, control circuitry could be adapted for generating timing signals or data from which timing signals can be derived. Data can be sent to a power layer interface for a single inverter that would, as discussed above, reconstruct the timing signals for changing the states of the solid state switches of the single inverter. In certain contexts, this could allow for simplification in product designs, product lines, modular power layers for inverters, modularity in programming of such circuitry, and so forth.

It should also be noted that, while particular techniques are disclosed herein for computation or recomputation of the timing signals used for driving the solid state switches of the inverters, other techniques may also be used. That is, information may be transmitted by the control circuitry to the power layer circuitry that permits switch timing to be established at the power layer circuitry by other algorithms.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for controlling operation of power inverter switches, comprising:
control circuitry configured to generate gate timing-related signals for timing of state changes of the switches;
a data conductor coupled to the control circuitry for conveying the gate timing-related signals from the control circuitry;
power layer circuitry coupled to the data conductor and configured to receive the gate timing-related signals and to recomputed the timing for the state changes based upon the received gate timing-related signals; and
a plurality of solid state switches coupled to the power layer circuitry and configured to change state to convert input power to controlled output power based upon the recomputed timing;
wherein the control circuitry is configured to periodically transmit synchronization signals to the power layer circuitry and the power layer circuitry is configured to adjust a power layer clock between the synchronization signals to compensate for variability in an operating frequency of an oscillator upon which the power layer clock is based.

2. The system of claim 1, wherein the power layer circuitry is configured to adjust the power layer clock based upon data sampled from the timing-related signals transmitted by the control circuitry.

3. The system of claim 2, wherein the power layer circuitry is configured to adjust the power layer clock based upon a number of data bits sampled between transition bits in the sampled data.

4. The system of claim 1, wherein the power layer circuitry is configured to acknowledge receipt of the synchronization signal.

5. The system of claim 4, wherein in the event of failure of the power layer circuitry to acknowledge receipt of the synchronization signal, the control circuitry is configured to command the power layer circuitry to operate on the basis of previous gate timing-related signals.

6. The system of claim 1, wherein the control circuitry is configured to generate a control event signal for synchronizing events in one or more operational modes of the system, and wherein the power layer circuitry is configured to receive the control event signal and to communicate with the control circuitry based on the control event signal and based on one of a plurality of operational modes of the system.

* * * * *